(12) United States Patent
Costello (10) Patent No.: US 11,777,244 B2
(45) Date of Patent: Oct. 3, 2023

(54) SOCKET CONNECTOR HAVING ARRAY OF SOCKET CONTACTS

(71) Applicant: TE Connectivity Services GmbH, Schaffhausen (CH)

(72) Inventor: Brian Patrick Costello, Scotts Valley, CA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 17/180,964

(22) Filed: Feb. 22, 2021

(65) Prior Publication Data

US 2022/0271465 A1 Aug. 25, 2022

(51) Int. Cl.

| H01R 13/00 | (2006.01) |
| H01R 13/24 | (2006.01) |
| H01R 13/05 | (2006.01) |
| H05K 7/10 | (2006.01) |
| H01R 13/11 | (2006.01) |
| B33Y 80/00 | (2015.01) |

(52) U.S. Cl.
CPC ......... *H01R 13/2421* (2013.01); *H01R 13/05* (2013.01); *H01R 13/11* (2013.01); *H05K 7/1092* (2013.01); *B33Y 80/00* (2014.12)

(58) Field of Classification Search
CPC .. H01R 13/2421; H01R 13/22; H01R 13/187; H01R 13/04; H01R 13/05; H01R 13/10; H01R 13/11; H05K 7/1092; H05K 7/1084; H05K 7/1069; H05K 7/10
USPC .................................................. 439/700, 66
See application file for complete search history.

(56) References Cited

U.S. PATENT DOCUMENTS

| 3,286,671 | A | | 11/1966 | Fuller | |
| 5,167,512 | A | * | 12/1992 | Walkup | H01R 13/2421 |
| | | | | | 439/65 |
| 5,414,369 | A | * | 5/1995 | Kazama | G01R 1/07314 |
| | | | | | 324/755.05 |
| 5,641,315 | A | * | 6/1997 | Swart | G01R 1/06722 |
| | | | | | 324/755.05 |
| 6,464,511 | B1 | * | 10/2002 | Watanabe | G01R 1/07371 |
| | | | | | 439/700 |
| 6,953,348 | B2 | * | 10/2005 | Yanagisawa | G01R 1/0441 |
| | | | | | 333/260 |
| 6,974,332 | B2 | * | 12/2005 | Ma | H01R 43/16 |
| | | | | | 439/71 |
| 7,102,369 | B2 | * | 9/2006 | Jung | G01R 1/06722 |
| | | | | | 324/755.05 |
| 7,140,884 | B2 | * | 11/2006 | Brodsky | H01R 13/2421 |
| | | | | | 439/700 |

(Continued)

*Primary Examiner* — Harshad C Patel (57) ABSTRACT

A socket connector includes an array of socket contacts arranged in rows and columns. The socket contacts have upper mating interfaces for mating with a first electronic package and lower mating interfaces for mating with a second electronic package. The socket contacts are configured to electrically connect the first and second electronic packages. Each socket contact includes an upper cap, a lower cap, and a spring beam helically coiled between the upper cap and the lower cap. The spring beam is compressible. The upper cap, the lower cap and the spring beam are additive manufactured such that the upper cap, the lower cap and the spring beam form a unitary, three-dimensional conductive structure to electrically connect the first and second electronic packages.

21 Claims, 4 Drawing Sheets

(56) References Cited

U.S. PATENT DOCUMENTS

| | | | |
|---|---|---|---|
| 7,256,593 B2* | 8/2007 | Treibergs | G01R 1/0466 |
| | | | 324/763.01 |
| 7,393,214 B2 | 7/2008 | DiStefano | |
| 7,507,110 B1* | 3/2009 | Yin | G01R 1/06722 |
| | | | 439/482 |
| 8,029,291 B2* | 10/2011 | Park | G01R 1/06722 |
| | | | 439/66 |
| 8,066,536 B2* | 11/2011 | Chen | H01R 13/2421 |
| | | | 439/824 |
| 8,562,359 B2* | 10/2013 | Alden, III | H01R 13/2421 |
| | | | 439/66 |
| 8,974,236 B2* | 3/2015 | Terhune, IV | H01R 12/714 |
| | | | 439/78 |
| 9,570,828 B2* | 2/2017 | Chui | H01R 13/2421 |
| 9,831,589 B2* | 11/2017 | Chui | G01R 1/06722 |
| 10,980,135 B2* | 4/2021 | Tate | H01R 13/2428 |
| 2004/0053539 A1* | 3/2004 | Watanabe | G01R 1/06722 |
| | | | 439/700 |
| 2005/0266734 A1* | 12/2005 | Kazama | G01R 1/07314 |
| | | | 439/700 |
| 2006/0189177 A1* | 8/2006 | Goodman | H01R 13/2421 |
| | | | 439/70 |
| 2007/0082515 A1* | 4/2007 | Goodman | H05K 7/1061 |
| | | | 439/70 |
| 2007/0111560 A1* | 5/2007 | Kazama | G01R 1/07371 |
| | | | 439/71 |
| 2012/0184116 A1 | 7/2012 | Pawlikowski et al. | |

\* cited by examiner

SOCKET CONNECTOR HAVING ARRAY OF SOCKET CONTACTS

BACKGROUND OF THE INVENTION

The subject matter herein relates generally to electrical interconnects.

Electrical interconnects are used to connect two opposing electronic packages. For instance, electrical interconnects may be provided between two circuit boards or a circuit board and an integrated circuit to transmit data and/or power therebetween. Some known electrical interconnects are surface mountable with an array of contacts having separable mating interfaces for connection to the electronic packages rather than by soldering the contacts to the electronic packages. Some known electrical interconnects use cantilevered beam contacts to provide a separable mating interface at distal ends of the cantilevered beams. However, such contacts require significant spacing between the contacts to have sufficient beam length for the cantilevered beams. Other known electrical interconnects use conductive elastomeric members rather than contacts with cantilevered beams. The conductive elastomeric members are compressible in a vertical direction and thus can have a smaller spacing between the contacts, which allows for higher density of contacts per surface area. However, conductive elastomeric members are not without disadvantages. For instance, the conductive elastomeric members may have a limited current carrying capacity, which limits power transfer through the electrical interconnect and/or increases the number of contacts needed for power transfer.

A need remains for interconnect systems that can accommodate the high component density and layout of certain electronic packages.

BRIEF DESCRIPTION OF THE INVENTION

In one embodiment, a socket connector is provided and includes an array of socket contacts arranged in rows and columns. The socket contacts have upper mating interfaces for mating with a first electronic package and lower mating interfaces for mating with a second electronic package. The socket contacts are configured to electrically connect the first and second electronic packages. Each socket contact includes an upper cap, a lower cap, and a spring beam helically coiled between the upper cap and the lower cap. The spring beam is compressible. The upper cap, the lower cap and the spring beam are additive manufactured such that the upper cap, the lower cap and the spring beam form a unitary, three-dimensional conductive structure to electrically connect the first and second electronic packages.

In another embodiment, a socket connector is provided and includes an array of socket contacts arranged in rows and columns. The socket contacts have upper mating interfaces for mating with a first electronic package and lower mating interfaces for mating with a second electronic package. The socket contacts are configured to electrically connect the first and second electronic packages. Each socket contact includes an upper cap, a lower cap, and a spring beam helically coiled between the upper cap and the lower cap. The spring beam is compressible. The upper cap, the lower cap and the spring beam are additive manufactured such that the upper cap, the lower cap and the spring beam form a unitary, three-dimensional conductive structure to electrically connect the first and second electronic packages. The socket connector includes a contact holder holding the socket contacts in the array. The contact holder includes a dielectric body surrounding the spring beams to provide structural support for the socket contacts. The dielectric body is compressible.

In a further embodiment, a socket contact for a socket connector is provided. The socket contact includes an upper cap having an inner surface and an outer surface. The outer surface defines an upper mating interface for a first electronic package. The socket contact includes a lower cap having an inner surface and an outer surface. The outer surface defines a lower mating interface for a first electronic package. The socket contact includes a first spring beam helically coiled between the upper cap and the lower cap. The first spring beam extends between the inner surfaces of the upper and lower caps. The socket contact includes a second spring beam helically coiled between the upper cap and the lower cap. The second spring beam extends between the inner surfaces of the upper and lower caps. The upper cap, the lower cap, the first spring beam and the second spring beam are additive manufactured such that the upper cap, the lower cap, the first spring beam and the second spring beam form a unitary, three-dimensional conductive structure to electrically connect the first and second electronic packages.

DETAILED DESCRIPTION OF THE INVENTION

Figure 1:
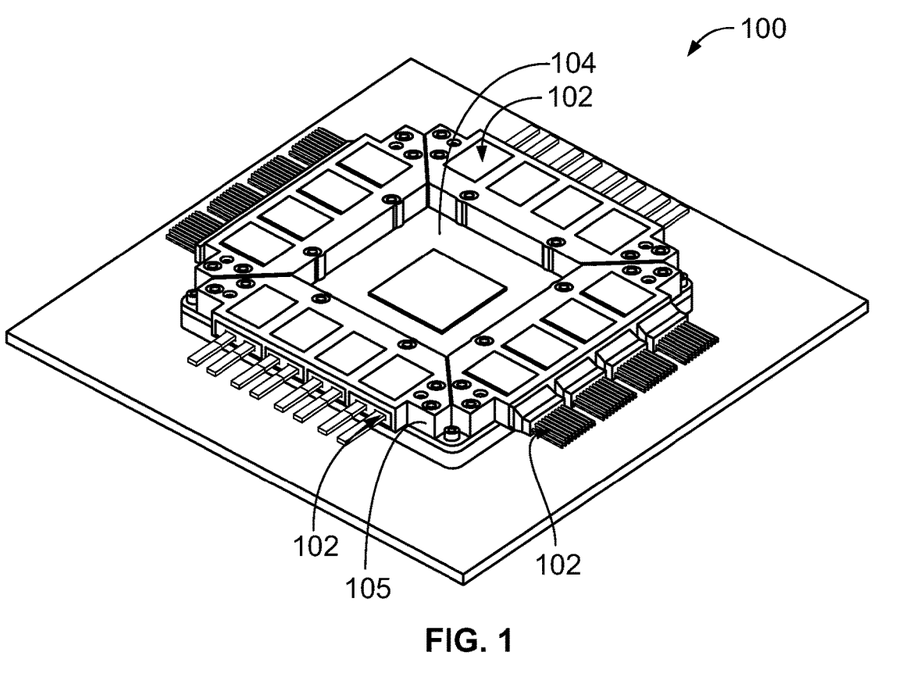
FIG. 1 illustrates an electronic assembly in accordance with an exemplary embodiment having a plurality of socket assemblies formed in accordance with an exemplary embodiment.
Figure 2:
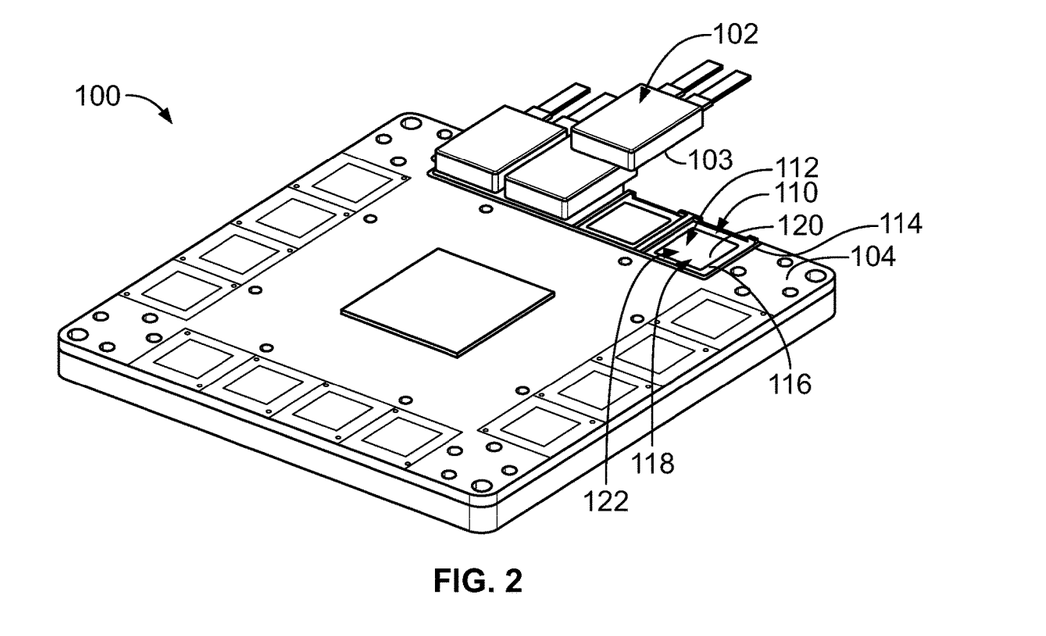
FIG. 2 is an exploded view of a portion of the electronic assembly shown in FIG. 1 in accordance with an exemplary embodiment.

FIG. 1 illustrates an electronic assembly 100 in accordance with an exemplary embodiment having a plurality of socket assemblies 110 (shown in FIG. 4) formed in accordance with an exemplary embodiment. FIG. 2 is an exploded view of a portion of the electronic assembly 100 shown in FIG. 1 in accordance with an exemplary embodiment. The socket assemblies 110 are used to interconnect first and second electronic packages 102, 104. The electronic packages 102 and 104 may be either circuit boards or electronic devices, such as a chip or module, such as, but not limited to, a central processing unit (CPU), microprocessor, an application specific integrated circuit (ASIC), or the like. As such, the socket assembly 110 may be one of a board-to-board, board-to-device, or device-to-device type of interconnect system.

In the illustrated embodiment, the first electronic package(s) 102 is/are coupled to corresponding socket assemblies 110 to electrically connect the first electronic packages 102 to the second electronic package 104. The first electronic packages 102 are electronic devices, such as pluggable modules configured to be plugged into the socket assemblies 110. For example, the first electronic packages 102 may be high speed cable connectors and/or fiber optic connectors. The first electronic packages 102 may include circuit boards 103 (FIG. 2) having pads at a mating interface to interface with the socket assemblies 110. Module holders 105 (FIG. 1) may be coupled to the first electronic packages 102 to position and press the first electronic packages 102 into contact with the socket assemblies 110. While the module holders 105 are shown in FIG. 1 as each holding four first electronic packages 102, it should be understood that the individual module holders could be employed to position and press each first electronic package (102). A heat sink (not shown) may be coupled to the tops of the first electronic packages 102 to dissipate heat from the first electronic packages 102.

In the illustrated embodiment, the second electronic package 104 is an integrated circuit, such as an ASIC. The socket assemblies 110 are mounted to a substrate or board of the ASIC, such as at the top surface, to allow connection of the first electronic packages 102 directly to the board of the ASIC. The second electronic package 104 may be mounted to and electrically connected to a circuit board, such as a host circuit board.

In an alternative embodiment, the second electronic package 104 may be a host circuit board and the first electronic package(s) 102 may be an ASIC or another circuit board, such as a mezzanine card. For example, the socket assembly 110 may be mounted on the second electronic package 104 (circuit board) to receive the first electronic package 102 (ASIC or pluggable module). Other types of electronic packages may be used in alternative embodiments.

The socket assembly 110 includes a socket connector 112. The socket connector 112 is used to electrically connect the electronic packages 102, 104. In an exemplary embodiment, the socket assembly 110 includes a housing or socket frame 114 that holds the socket connector 112. Optionally, the socket frame 114 includes frame members 116 forming a socket opening 118 that receives the first electronic package 102. The frame members 116 locate the first electronic package 102 relative to the socket connector 112. The socket frame 114 is configured to be coupled to the electronic package 104. The socket frame 114 is used to position the socket assembly 110, and the socket connector 112, with respect to the electronic package 104. The socket frame 114 may operate as an anti-overstress load bearing member that stops or limits compression of the socket connector 112 (such as contacts of the socket connector 112) when the electronic assembly 100 is assembled. In various embodiments, the socket frame 114 may completely surround the perimeter of the socket connector 112. Optionally, the socket frame 114 may have separate components provided at predetermined portions, such as at corners, of the socket assembly 110. The first electronic package 102 is loaded into the socket opening 118. The frame members 116 orient the first electronic package 102 relative to the socket connector 112. When mated with the socket connector 112, the first electronic package 102 is electrically connected to the electronic package 104.

In an exemplary embodiment, the socket connector 112 includes a plurality of socket contacts 120 arranged in and held in a contact array 122. The contacts 120 within the contact array 122 are arranged in a predetermined pattern, such as in rows and columns.

The first electronic package 102 has a mating interface having a plurality of the contact pads (not shown in FIG. 1) that engage the contacts 120. The electronic package 104 also has a mating interface having a plurality of the contact pads (not shown in FIG. 1) that engage the contacts 120. The mating interfaces of the first and second electronic packages 102, 104 may be land grid array (LGA) interfaces. In alternative embodiments, the mating interfaces of the first and/or second electronic packages 102, 104 may be ball grid array (BGA) interfaces. The mating interfaces may have substantially similar pattern as the contacts 120 for mating thereto.

Figure 3:
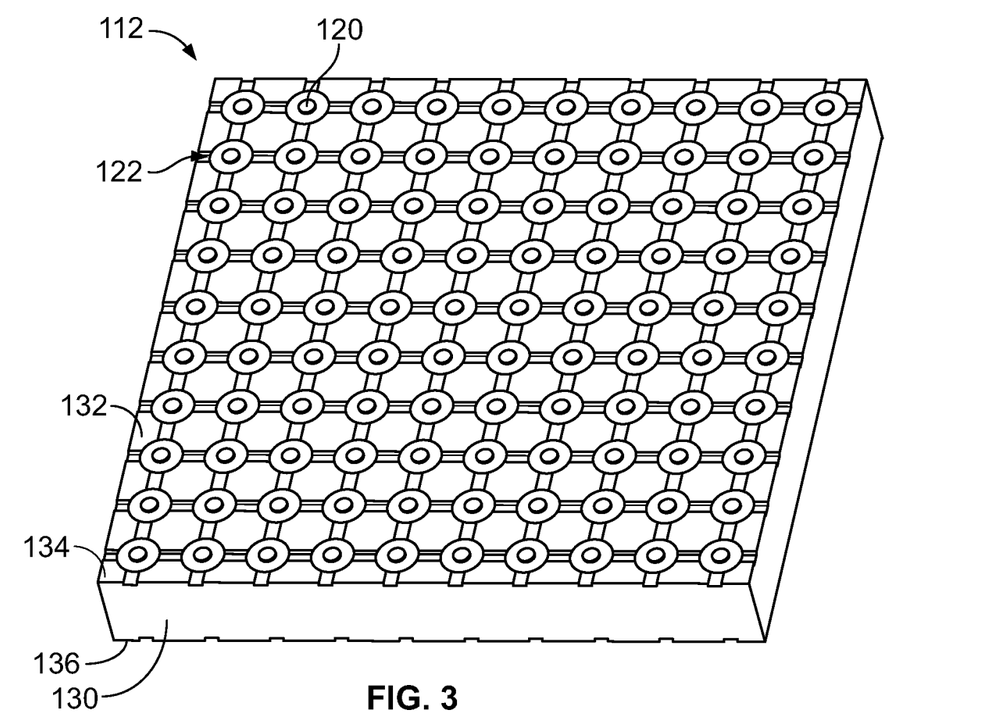
FIG. 3 is a perspective view of a portion of the socket connector in accordance with an exemplary embodiment.

FIG. 3 is a perspective view of a portion of the socket connector 112 in accordance with an exemplary embodiment. The socket connector 112 includes the array 122 of socket contacts 120 arranged in rows and columns. In an exemplary embodiment, the socket connector 112 includes a contact holder 130 holding the socket contacts 120. Optionally, multiple contact holders 130 and corresponding socket contacts 120 may be arrayed together to form the socket connector 112. For example, the contact holders 130 and socket contacts 120 may be formed as units that are stacked side-by-side and coupled together to form the socket connector 112. For example, the units may be made in 10×10 arrays, 25×25 arrays, 100×100 arrays, or other sizes, and then stacked together to form a socket connector 112 of appropriate size.

The contact holder 130 includes a dielectric body 132 that supports the socket contacts 120. The contact holder 130 includes an upper surface 134 and a lower surface 136 opposite the upper surface 134. The socket contacts 120 are exposed at the upper surface 134 and the lower surface 136 for mating with the first and second electronic packages 102, 104 (shown in FIG. 1). In an exemplary embodiment, the dielectric body 132 is formed in place around the array of socket contacts 120. For example, the dielectric body 132 may be backfilled around the socket contacts 120. In various embodiments, the dielectric body 132 may be molded in situ around the socket contacts 120. For example, the socket contacts 120 may be initially held together by a carrier structure 140 (shown in FIG. 7) and then the material of the dielectric body 132 may be injected or poured into place around the socket contacts 120. In various embodiments, the dielectric body 132 is a compliant material, such as foam or an elastomer material. The dielectric body 132 may be compressible to allow compression of the socket contacts 120 during mating with the first and second electronic packages 102, 104.

Figure 4:
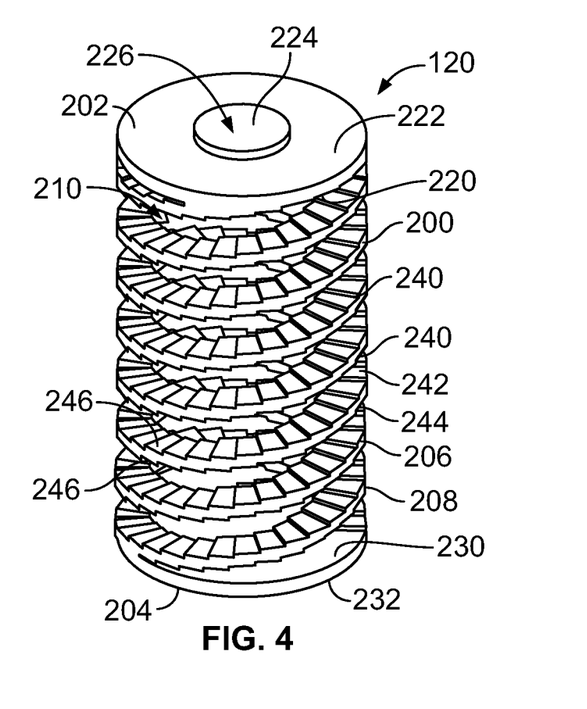
FIG. 4 is a perspective view of the socket contact in accordance with an exemplary embodiment.
Figure 5:
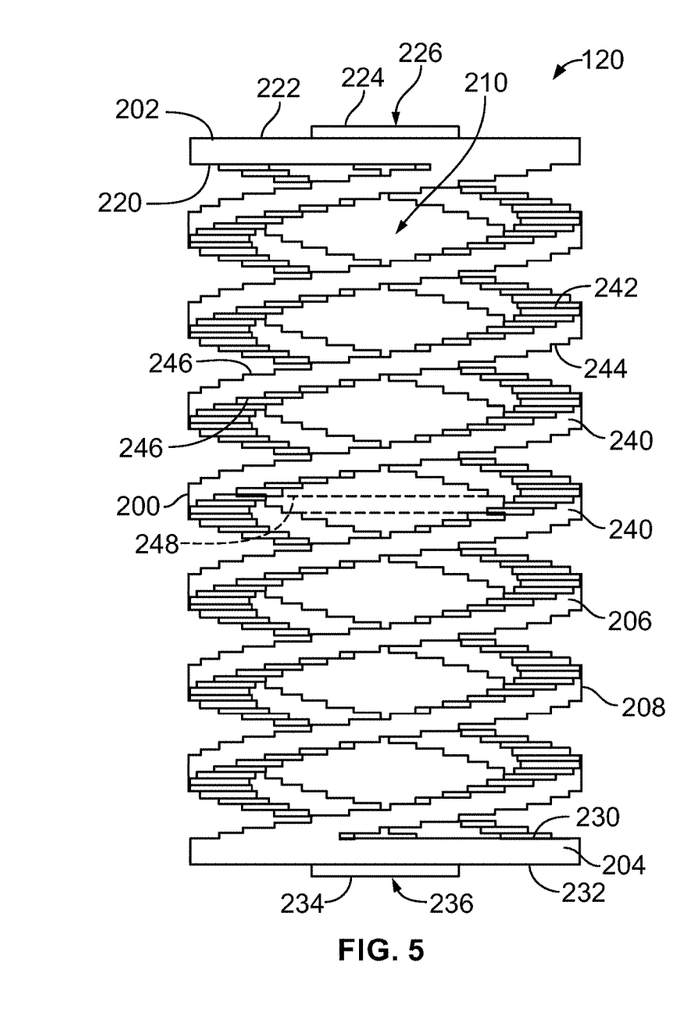
FIG. 5 is a front view of the socket contact in accordance with an exemplary embodiment.
Figure 6:
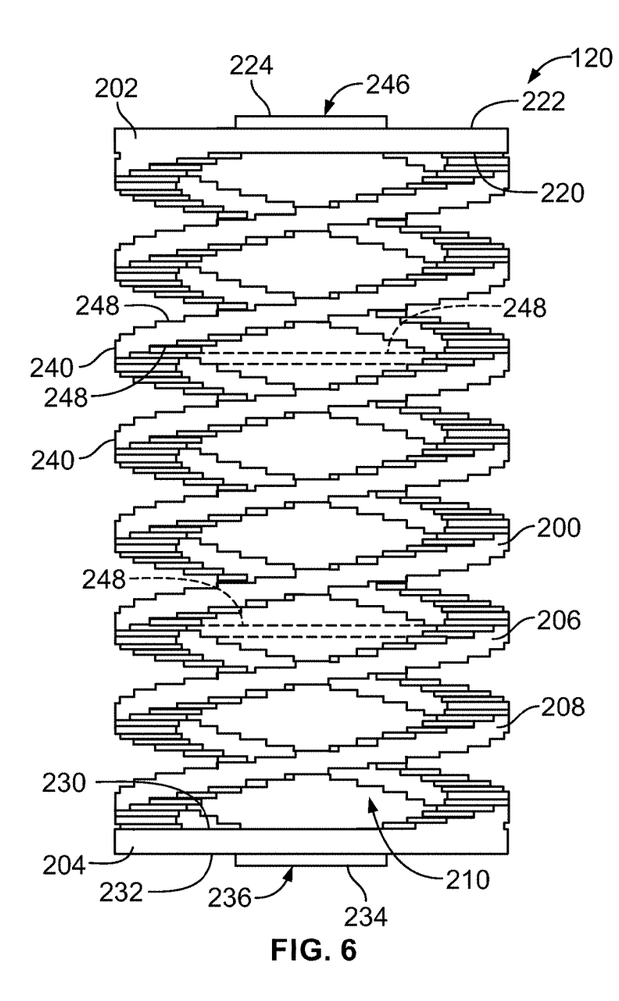
FIG. 6 is a side view of the socket contact in accordance with an exemplary embodiment.

FIG. 4 is a perspective view of the socket contact 120 in accordance with an exemplary embodiment. FIG. 5 is a front view of the socket contact 120 in accordance with an exemplary embodiment. FIG. 6 is a side view of the socket contact 120 in accordance with an exemplary embodiment.

The socket contact 120 includes a contact body 200 providing a conductive path between an upper mating interface and a lower mating interface to electrically connect the first and second electronic packages 102, 104. In an exemplary embodiment, the contact body 200 is a unitary, monolithic structure. For example, the contact body 200 does not include any additional interfaces (for example, separate parts) between the upper and lower mating interfaces. In an exemplary embodiment, the contact body 200 is manufactured by an additive manufacturing process from a conductive material, such as a copper material, a copper alloy material, or another conductive metal material. For example, the contact body 200 may be manufactured from a 3D printing process. The contact body 200 may be built-up as layers from the bottom to the top of the socket contact 120.

In an exemplary embodiment, the socket contact 120 includes an upper cap 202, a lower cap 204, a first spring beam 206, and a second spring beam 208. The socket contact 120 may include greater or fewer spring beams in alternative embodiments. The spring beams 206, 208 extend between the upper and lower caps 202, 204. In an exemplary embodiment, the upper cap 202, the lower cap 204, the first spring beam 206 and the second spring beam 208 are additive manufactured such that the upper cap 202, the lower cap 204, the first spring beam 206 and the second spring beam 208 form a unitary, three-dimensional conductive structure to electrically connect the first and second electronic packages 102, 104. For example, the upper cap 202, the lower cap 204, the first spring beam 206 and the second spring beam 208 may be 3D printed with the spring beams 206, 208 built up on the lower cap 204 and with the upper cap 202 built up on the spring beams 206, 208. In an exemplary embodiment, the spring beams 206, 208 are helically coiled between the upper cap 202 and the lower cap 204. The socket contact 120 includes a hollow core 210 between the upper and lower caps 202, 204. The spring beams 206, 208 are wrapped around and surround the hollow core 210. The spring beams 206, 208 are compressible, such as when the upper and lower caps 202, 204 are coupled to the first and second electronic packages 102, 104, respectively.

In an exemplary embodiment, the upper cap 202 is symmetrical for improved signal integrity. For example, the upper cap 202 may be circular. However, the upper cap 202 may have other shapes in alterative embodiments, such as being rectangular or having another shape. The upper cap 202 includes an inner surface 220 and an outer surface 222 opposite the inner surface 220. The inner surface 220 defines a bottom of the upper cap 202 and the outer surface 222 defines a top of the upper cap 202. The inner surface 220 faces the hollow core 210. The spring beams 206, 208 extend from the inner surface 220. In an exemplary embodiment, the upper cap 202 includes an upper pedestal 224 at the outer surface 222. The upper pedestal 224 defines an upper mating interface 226 for mating with the first electronic package 102. The upper pedestal 224 has a smaller surface area than the outer surface 222 for improved positioning of the upper mating interface 226. Optionally, the outer surface 222 and/or the pedestal 224 may be plated with one or more plating layers, such as a nickel plating layer, a gold plating layer, and the like.

In an exemplary embodiment, the lower cap 204 is symmetrical for improved signal integrity. For example, the lower cap 204 may be circular. However, the lower cap 204 may have other shapes in alterative embodiments, such as being rectangular or having another shape. The lower cap 204 includes an inner surface 230 and an outer surface 232 opposite the inner surface 230. The inner surface 230 defines a top of the lower cap 204 and the outer surface 232 defines a bottom of the lower cap 204. The inner surface 230 faces the hollow core 210. The spring beams 206, 208 extend from the inner surface 230. In an exemplary embodiment, the lower cap 204 includes a lower pedestal 234 at the outer surface 232. The lower pedestal 234 defines a lower mating interface 236 for mating with the second electronic package 104. The lower pedestal 234 has a smaller surface area than the outer surface 232 for improved positioning of the lower mating interface 236. Optionally, the outer surface 232 and/or the pedestal 234 may be plated with one or more plating layers, such as a nickel plating layer, a gold plating layer, and the like.

The spring beams 206, 208 may be identical to each other, being radially offset from each other, such as offset 180° relative to each other. In embodiments having three spring beams, the spring beams may be offset 120° from each other. In embodiments having four spring beams, the spring beams may be offset 90° from each other. The spring beams 206, 208 are helically wrapped around the hollow core 210. The spring beams 206, 208 surround an exterior of the hollow core 210. Each spring beam 206, 208 includes multiple coils 240 (each coil 240 extends 360°. The coils 240 of the spring beams 206, 208 are interleaved with each other in a stacked arrangement. Space is provided between the coils 240 to allow compression of the spring beams 206, 208 when the socket contact 120 is mated with the electronic packages 102, 104.

The spring beams 206, 208 are integral with the lower cap 204 and integral with the upper cap 202, such as being additive manufactured with the upper and lower caps 202, 204. In an exemplary embodiment, each spring beam 206, 208 includes an upper surface 242 and a lower surface 244. The upper surface 242 of the first spring beam 206 faces the lower surface 244 of the second spring beam 208. Similarly, the upper surface 242 of the second spring beam 208 faces the lower surface 244 of the first spring beam 206. In an exemplary embodiment, each spring beam 206, 208 includes a series of steps 246 between the lower cap 204 and the upper cap 202. For example, the upper surfaces 242 are stepped and the lower surfaces 244 are stepped. The steps 246 are formed during the additive manufacturing process. For example, the layers forming the coils 240 are slightly radially offset from the previous layer to form the steps in a helical pattern. Optionally, the upper surfaces 242 and/or the lower surfaces 244 may be plated with one or more plating layers, such as a nickel plating layer, a gold plating layer, and the like. The plating layers may be applied to smooth out the steps 246, such as to at least partially fill in the risers of the steps 246, which may improve signal integrity of signals transmitted by the spring beams 206, 208.

Optionally, tie beams 248 (shown in phantom in FIGS. 5 and 6) may be provided extending across the hollow core 210 between the first and second beams 206, 208 at an elevation remote from the lower cap 204 and remote from the upper cap 202. The tie beams 248 may provide structural support for the spring beams 206, 208, such as at locations approximately centered between the upper and lower caps 202, 204. The tie beams 248 electrically connect the spring beams 206, 208.

Figure 7:
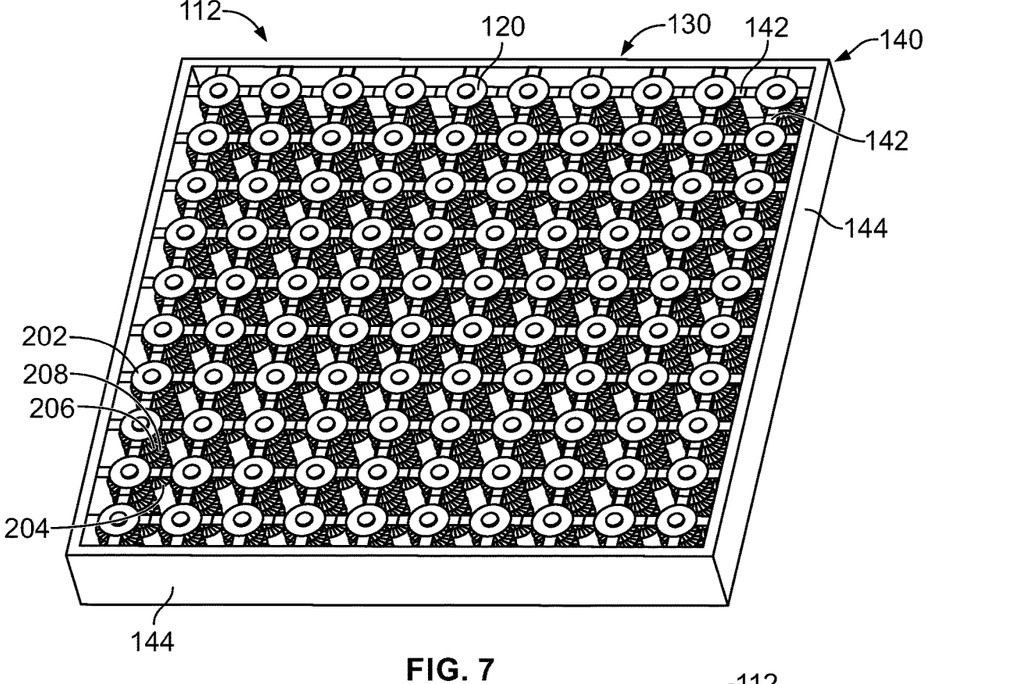
FIG. 7 illustrates a portion of the socket connector in accordance with an exemplary embodiment showing a portion of the contact holder holding the array of socket contacts.

FIG. 7 illustrates a portion of the socket connector 112 in accordance with an exemplary embodiment showing a portion of the contact holder 130 holding the array of socket contacts 120. The contact holder 130 includes a carrier structure 140 holding the socket contacts 120 relative to each other. FIG. 7 illustrates the contact holder 130 without the dielectric body 132 (shown in FIG. 3).

The carrier structure 140 includes connecting beams 142 and side walls 144. The connecting beams 142 extend between the socket contacts 120 to support the socket contacts 120 relative to each other. The connecting beams 142 extend between the side walls 144 and the socket contacts 120 to support the socket contacts 120 relative to the side walls 144. The connecting beams 142 hold relative positions of the socket contacts 120 in the rows and columns. In an exemplary embodiment, the connecting beams 142 extend from the upper caps 202 and may extend from the lower caps 204. The connecting beams 142 may additionally or alternatively extend from the spring beams 206, 208. In an exemplary embodiment, the connecting beams 142 and the side walls 144 are additive manufactured with the socket contacts 120. For example, the connecting beams 142 and the side walls 144 are 3D printed with the socket contacts 120.

Figure 8:
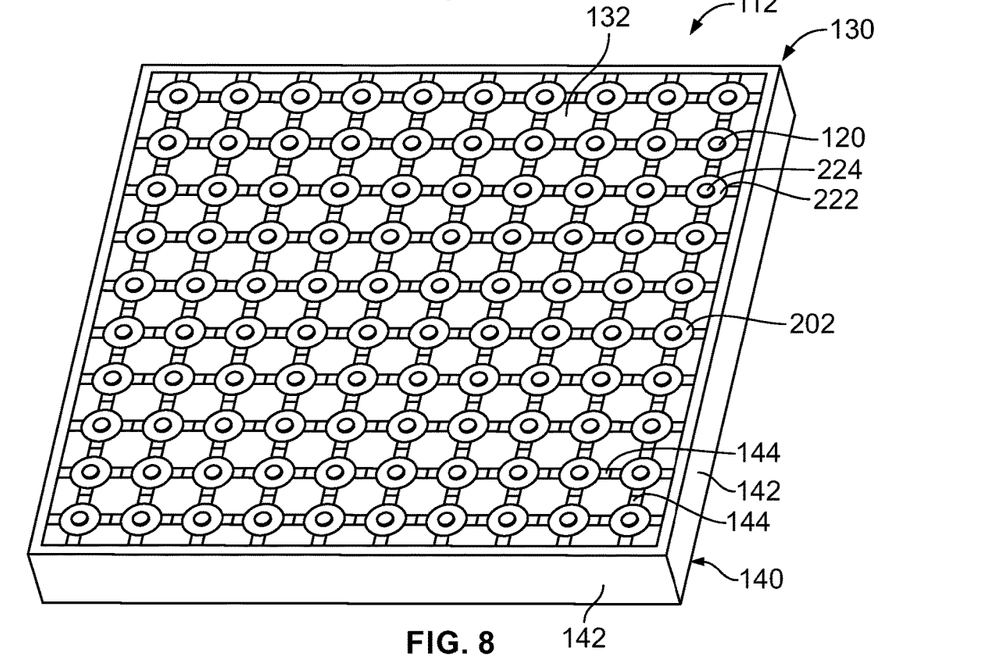
FIG. 8 illustrates the socket connector in accordance with an exemplary embodiment showing the contact holder holding the array of socket contacts.

FIG. 8 illustrates the socket connector 112 in accordance with an exemplary embodiment showing the contact holder 130 holding the array of socket contacts 120. In an exemplary embodiment, the carrier structure 140 is backfilled with the material of the dielectric body 132 to support the socket contacts 120. In an exemplary embodiment, the material of the dielectric body 132 is configured to be filled between the socket contacts 120 and is configured to be filled inside the hollow cores of the socket contacts 120. For example, the dielectric body 132 is located interior of each socket contacts 120 between the upper cap 202 and the lower cap 204 and the dielectric body 132 is located exterior of each socket contacts 120 filling the space between the socket contacts 120. The material of the dielectric body 132 may be filled against the side walls 144 of the carrier structure 140. The connecting beams 142 may extend along the dielectric body 132 and/or may extend through the dielectric body 132. The dielectric body 132 may be foam or elastomeric material that is compressible to supports the socket contacts 120 and prevent over-compression of the socket contacts 120.

In an exemplary embodiment, portions of the carrier structure 140 may be sacrificial. For example, the connecting beams 142 and the side walls 144 may be removed after the dielectric body 132 is backfilled around the socket contacts 120. As such, while the connecting beams 142 and the side walls 144 may initially support the socket contacts 120, the connecting beams 142 and the side walls 144 are removable to electrically separate the socket contacts 120 from each other. Optionally, the connecting beams 142 may be selectively removed, leaving at least some of the connecting beams 142 in place in the final product. For example, connecting beams 142 may remain between ground socket contacts to electrically common the ground socket contacts. Connecting beams 142 may remain between power socket contacts to electrically common the power socket contacts. The connecting beams 142 are removed between signal socket contacts to electrically separate the signal socket contacts from other socket contacts.

In an exemplary embodiment, the socket contacts 120 are plated, such as after the dielectric body 132 is in place. For example, the upper caps 202 and the lower caps 204 may be plated with nickel plating and/or gold plating. For example, the outer surfaces 222, 232 may be plated with nickel plating and the pedestals 224, 234 may be plated with gold plating. Optionally, the connecting beams 142 and the side walls 144 are unplated. The unplated portions of the connecting structure 140 may be removed, such as by etching (for example, chemical etching, laser etching, and the like) the connecting structure 140. FIG. 3 illustrates the socket connector 112 with the connecting structure 140 removed (for example, without the connecting beams 142 and without the side walls 144.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket connector comprising:
   an array of socket contacts arranged in rows and columns, the socket contacts having upper mating interfaces for mating with a first electronic package and lower mating interfaces for mating with a second electronic package, the socket contacts configured to electrically connect the first and second electronic packages;
   each socket contact including an upper cap, a lower cap, and a spring beam helically coiled between the upper cap and the lower cap without any other intervening structures connecting the upper cap and the lower cap, the socket contact having an electrical path through the helically coiled spring beam such that the helically coiled spring beam is electrically connecting the upper cap and the lower cap, the spring beam supporting the upper cap relative to the lower cap, the spring beam being compressible, the upper cap, the lower cap and the spring beam being additive manufactured from a common material, the upper cap, the lower cap and the spring beam being integral and forming a unitary, three-dimensional conductive structure via the common material of the upper cap, the lower cap, and the spring beam to electrically connect the first and second electronic packages.

2. The socket connector of claim 1, wherein the upper cap, the lower cap and the spring beam are 3D printed to form the unitary, three-dimensional conductive structure.

3. The socket connector of claim 1, wherein the spring beam includes a series of steps between the lower cap and the upper cap.

4. The socket connector of claim 1, wherein the spring beam is a first spring beam, the socket contact further including a second spring beam helically coiled between the upper cap and the lower cap, the second spring beam being additive manufactured with the first spring beam between the lower cap and the upper cap.

5. The socket connector of claim 4, wherein the first and second spring beams are 180° offset from each other between the upper cap and the lower cap.

6. The socket connector of claim 4, further comprising a third spring beam between the first spring beam and the second spring beam.

7. The socket connector of claim 4, wherein the first spring beam includes at least two coils and the second spring beam includes at least two coils.

8. The socket connector of claim 4, wherein the socket contact includes a tie beam between the first and second beams at an elevation remote from the lower cap and remote from the upper cap.

9. The socket connector of claim 1, wherein the socket contact includes a hollow core between the lower cap and the upper cap, the spring beam surround the hollow core.

10. The socket connector of claim 1, wherein the upper cap, the lower cap and the spring beam are additive manufactured from a copper, copper alloy, or other conductive material, the upper cap having a plating layer at an outer surface of the upper cap, the lower cap having a plating layer at an outer surface of the lower cap.

11. The socket connector of claim 10, wherein the spring beam includes an upper plating layer on an outer surface of the spring beam and a lower plating layer on a lower surface of the spring beam.

12. The socket connector of claim 1, wherein the socket contacts are held together by sacrificial connecting beams additive manufactured with the socket contacts to position the socket contacts relative to each other.

13. The socket connector of claim 1, further comprising a contact holder holding the socket contacts in the array, the contact holder including a dielectric body surrounding the spring beams to provide structural support for the socket contacts, the dielectric body being compressible.

14. The socket connector of claim 13, wherein the dielectric body is formed in place around the socket contacts.

15. The socket connector of claim 13, wherein the dielectric body is located interior of each socket contact between the upper cap and the lower cap, and wherein the dielectric body is located exterior of each socket contact filling the space between the socket contacts.

16. The socket connector of claim 13, further comprising conductive tie bars between corresponding signal contacts to electrically connect to corresponding signal contacts, the conductive tie bars extending at least one of along or through the dielectric body.

17. The socket connector of claim 1, wherein the upper cap includes a pedestal extending from an upper surface of the upper cap and the lower cap includes a pedestal extending from a lower surface of the lower cap, the pedestal of the upper cap defining the upper mating interface, the pedestal of the lower cap defining the lower mating interface.

18. A socket connector comprising:
an array of socket contacts arranged in rows and columns, the socket contacts having upper mating interfaces for mating with a first electronic package and lower mating interfaces for mating with a second electronic package, the socket contacts configured to electrically connect the first and second electronic packages;
each socket contact including an upper cap, a lower cap, and a spring beam helically coiled between the upper cap and the lower cap, the spring beam being compressible, the upper cap, the lower cap and the spring beam being additive manufactured such that the upper cap, the lower cap and the spring beam form a unitary, three-dimensional conductive structure to electrically connect the first and second electronic packages, wherein the spring beam includes an upper surface and a lower surface opposite the upper surface, the upper surface being stepped, the lower surface being stepped.

19. The socket connector of claim 18, wherein the upper cap, the lower cap and the spring beam are manufactured from the same material.

20. A socket connector comprising:
an array of socket contacts arranged in rows and columns, the socket contacts having upper mating interfaces for mating with a first electronic package and lower mating interfaces for mating with a second electronic package, the socket contacts configured to electrically connect the first and second electronic packages, each socket contact including an upper cap, a lower cap, and a spring beam helically coiled between the upper cap and the lower cap without any other intervening structures connecting the upper cap and the lower cap, the socket contact having an electrical path through the helically coiled spring beam such that the helically coiled spring beam is electrically connecting the upper cap and the lower cap, the spring beam supporting the upper cap relative to the lower cap, the spring beam being compressible, the upper cap, the lower cap and the spring beam being additive manufactured from a common material, the upper cap, the lower cap and the spring beam being integral and forming a unitary, three-dimensional conductive structure to electrically connect the first and second electronic packages via the common material of the upper cap, the lower cap, and the spring beam; and
a contact holder holding the socket contacts in the array, the contact holder including a dielectric body surrounding the spring beams to provide structural support for the socket contacts, the dielectric body being compressible.

21. A socket contact for a socket connector, the socket contact comprising:
an upper cap having an inner surface and an outer surface, the outer surface defining an upper mating interface for a first electronic package;
a lower cap having an inner surface and an outer surface, the outer surface defining a lower mating interface for a second electronic package;
a first spring beam helically coiled between the upper cap and the lower cap, the first spring beam extending between the inner surfaces of the upper and lower caps; and
a second spring beam helically coiled between the upper cap and the lower cap, the second spring beam extending between the inner surfaces of the upper and lower caps;
wherein the upper cap, the lower cap, the first spring beam and the second spring beam are additive manufactured from a common material, the upper cap, the lower cap, the first spring beam, and the second spring beam being integral and forming a unitary, three-dimensional conductive structure without any other intervening structures connecting the upper cap and the lower cap to electrically connect the first and second electronic packages via the common material of the upper cap, the lower cap, the first spring beam, and the second spring beam, wherein a first electrical path is defined between the upper cap and the lower cap through the helically coiled first spring beam and wherein a second electrical path is defined between the upper cap and the lower cap through the helically coiled second spring beam, the first and second spring beams electrically connecting the upper cap and the lower cap via the first and second electrical paths of the first and second spring beams, the first and second spring beams supporting the upper cap relative to the lower cap.

* * * * *